United States Patent
Horzella et al.

(10) Patent No.: US 12,389,548 B2
(45) Date of Patent: *Aug. 12, 2025

(54) MILLING OF FLEX FOIL WITH TWO CONDUCTIVE LAYERS FROM BOTH SIDES

(71) Applicant: DP PATTERNING AB, Norrkoping (SE)

(72) Inventors: Jan Horzella, Balgheim (DE); Fritz Jung, Fuchstal (DE)

(73) Assignee: DP PATTERNING AB, Norrkoping (SE)

( * ) Notice: Subject to any disclaimer, the term of this patent is extended or adjusted under 35 U.S.C. 154(b) by 491 days.

This patent is subject to a terminal disclaimer.

(21) Appl. No.: 17/603,432

(22) PCT Filed: Apr. 3, 2020

(86) PCT No.: PCT/US2020/026630
§ 371 (c)(1),
(2) Date: Oct. 13, 2021

(87) PCT Pub. No.: WO2020/214437
PCT Pub. Date: Oct. 22, 2020

(65) Prior Publication Data
US 2022/0192028 A1  Jun. 16, 2022

Related U.S. Application Data

(63) Continuation of application No. 16/389,277, filed on Apr. 19, 2019, now Pat. No. 10,709,022.

(51) Int. Cl.
*H05K 3/04* (2006.01)
*B02C 23/00* (2006.01)
(Continued)

(52) U.S. Cl.
CPC ............. *H05K 3/043* (2013.01); *B02C 23/00* (2013.01); *B02C 23/14* (2013.01); *B02C 23/38* (2013.01);
(Continued)

(58) Field of Classification Search
CPC ................ H05K 3/043; H05K 3/0044; H05K 2203/0228; B02C 23/00; B02C 23/38
(Continued)

(56) References Cited

U.S. PATENT DOCUMENTS 4,020,548 A   5/1977  Pohl
4,877,174 A   10/1989 Bruhn
(Continued)

FOREIGN PATENT DOCUMENTS

CN   1564648 A   1/2005
CN   1985552 A   6/2007
(Continued)

OTHER PUBLICATIONS

International Search Report and Written Opinion of the ISA issued in PCT/US2020/026630, mailed Jun. 29, 2020; ISA/EP.
(Continued)

*Primary Examiner* — Mohammed S. Alawadi
(74) *Attorney, Agent, or Firm* — Kagan Binder, PLLC

(57) ABSTRACT

A method for milling flex foil includes providing a web (14) of flex foil including a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. The method includes dry milling one side of the web using a milling wheel (20-1) and a first cliche pattern (25-1) (including a rotating drum (24-1) and a flexible substrate (26-1)) including raised portions and
(Continued)

non-raised portions to selectively remove at least one of the first conductive layer and the first insulating layer. The method includes dry milling an opposite side of the web using a milling wheel (20-2) and a second cliche pattern (25-2) including upper raised portions, lower raised portions and non-raised portions to selectively remove the second insulating layer.

8 Claims, 5 Drawing Sheets

(51) Int. Cl.
    *B02C 23/14*     (2006.01)
    *B02C 23/38*     (2006.01)
    *H05K 1/02*     (2006.01)
    *H05K 1/03*     (2006.01)
    *H05K 3/00*     (2006.01)

(52) U.S. Cl.
    CPC ........... *H05K 1/028* (2013.01); *H05K 3/0044* (2013.01); *H05K 2203/0143* (2013.01); *H05K 2203/0228* (2013.01)

(58) Field of Classification Search
    USPC .......................................................... 241/14
    See application file for complete search history.

(56) References Cited

U.S. PATENT DOCUMENTS

| | | |
|---|---|---|
| 5,119,070 A | 6/1992 | Matsumoto et al. |
| 5,174,847 A | 12/1992 | Pichl |
| 5,343,616 A | 9/1994 | Roberts |
| 5,476,546 A | 12/1995 | Zibulla |
| 5,690,738 A | 11/1997 | Boelkins |
| 5,945,131 A | 8/1999 | Harvey et al. |
| 6,083,837 A | 7/2000 | Millet |
| 6,133,142 A | 10/2000 | Tran et al. |
| 6,543,130 B1 | 4/2003 | Wittmaier |
| 6,568,285 B1 | 5/2003 | Moore et al. |
| 7,919,027 B2 | 4/2011 | Nordlinder et al. |
| D687,101 S | 7/2013 | Sternberg |
| D737,374 S | 8/2015 | Sternberg |
| D737,900 S | 9/2015 | Sternberg |
| 9,748,431 B1 | 8/2017 | Bachman |
| 10,667,394 B1 | 5/2020 | Ciaccio |
| 10,709,022 B1 | 7/2020 | Horzella et al. |
| 11,134,575 B2 | 9/2021 | Hughes |
| 11,297,718 B2 | 4/2022 | Ciaccio |
| 2001/0013171 A1 | 8/2001 | Meisser et al. |
| 2002/0073920 A1 | 6/2002 | Obermark |
| 2003/0051806 A1 | 3/2003 | Appalucci et al. |
| 2003/0218274 A1 | 11/2003 | Boutilier et al. |
| 2005/0016343 A1 | 1/2005 | Frendle et al. |
| 2005/0093401 A1 | 5/2005 | Raisanen |
| 2007/0184743 A1 | 8/2007 | Nordlinder et al. |
| 2007/0214637 A1 | 9/2007 | Nakanishi et al. |
| 2008/0138500 A1 | 6/2008 | Spaggiari |
| 2009/0008031 A1 | 1/2009 | Gould et al. |
| 2011/0036217 A1 | 2/2011 | Schneider |
| 2011/0056732 A1 | 3/2011 | Uratsuji |
| 2011/0253439 A1* | 10/2011 | Huang .................... B23K 11/11 156/247 |
| 2012/0003783 A1 | 1/2012 | Malik, Jr. |
| 2012/0081775 A1 | 4/2012 | Ersman et al. |
| 2012/0126931 A1 | 5/2012 | Batting et al. |
| 2012/0164384 A1 | 6/2012 | Cao et al. |
| 2013/0175289 A1 | 7/2013 | Sternberg |
| 2014/0048993 A1 | 2/2014 | Trzaskos |
| 2014/0069697 A1 | 3/2014 | Van Den Brand et al. |
| 2015/0246523 A1 | 9/2015 | Hwang et al. |
| 2018/0038754 A1 | 2/2018 | Marsh |
| 2019/0021161 A1* | 1/2019 | Coakley .................. H05K 3/06 |
| 2019/0035681 A1 | 1/2019 | Kuang et al. |
| 2019/0097112 A1 | 3/2019 | Spillner et al. |
| 2019/0355681 A1 | 11/2019 | Kong et al. |
| 2020/0053873 A1 | 2/2020 | Schaetzle |
| 2020/0242440 A1 | 7/2020 | Huhtasalo et al. |
| 2020/0260576 A1 | 8/2020 | Lammel et al. |
| 2020/0406573 A1 | 12/2020 | Huhtasalo et al. |
| 2021/0129235 A1 | 5/2021 | Picl et al. |
| 2021/0204400 A1 | 7/2021 | Schaetzle |

FOREIGN PATENT DOCUMENTS

| | | |
|---|---|---|
| CN | 102714919 A | 10/2012 |
| CN | 103430328 A | 12/2013 |
| CN | 105813392 A | 7/2016 |
| CN | 106457858 A | 2/2017 |
| CN | 107241865 A | 10/2017 |
| CN | 108566732 A | 9/2018 |
| CN | 109049131 A | 12/2018 |
| CN | 208438401 U | 1/2019 |
| CN | 110625670 A | 12/2019 |
| CN | 112589913 A | 4/2021 |
| CN | 113728732 A | 11/2021 |
| DE | 3246891 A1 | 6/1984 |
| DE | 3507846 C1 | 8/1986 |
| DE | 102016006064 A1 | 11/2017 |
| DE | 202017000997 U1 | 5/2018 |
| DE | 102017000290 B3 | 6/2018 |
| DE | 102017001424 A1 | 8/2018 |
| DE | 102017006128 A1 | 1/2019 |
| DE | 102019006317 B3 | 1/2021 |
| EP | 0638376 A1 | 2/1995 |
| EP | 2323821 A2 | 5/2011 |
| EP | 1665912 B1 | 7/2012 |
| EP | 3222367 A1 | 9/2017 |
| EP | 4018788 A1 | 6/2022 |
| GB | 933385 A | 8/1963 |
| JP | 6076659 A | 3/1994 |
| JP | 6140741 A2 | 5/1994 |
| JP | 7068496 A | 3/1995 |
| JP | H0768496 A | 3/1995 |
| JP | 7226574 A | 8/1995 |
| JP | 2001111200 A | 4/2001 |
| JP | 2001257448 A | 9/2001 |
| JP | 2003152310 A | 5/2003 |
| JP | 2008205492 A | 9/2008 |
| JP | 2009272647 A | 11/2009 |
| SE | 320570 B | 2/1970 |
| TW | 201722703 A | 7/2017 |
| WO | WO-2005027599 A1 | 3/2005 |
| WO | 2015195363 A1 | 12/2015 |
| WO | 2017042617 A1 | 3/2017 |
| WO | 2018130372 A1 | 7/2018 |
| WO | 18149535 A1 | 8/2018 |
| WO | 19068826 A1 | 4/2019 |
| WO | WO-2019068826 A1 | 4/2019 |
| WO | 2021059258 A1 | 4/2021 |
| WO | 2021067129 A1 | 4/2021 |

OTHER PUBLICATIONS

Chinese Office Action for corresponding Chinese Application No. 202080029531.7 dated May 23, 2024.
Search Report issued in corresponding Chinese Patent Application 202080029531.7 dated Sep. 13, 2024.
DE-102017001424-A1 (translation) (Year: 2023).
WO-2019068826-A1 (translation) (Year: 2023).
U.S. Appl. No. 16/918,474, filed Jul. 1, 2020, Jan Horzella.
Janghoon Park et al., Roll-to-Roll Coating Technology and Its Applications: A Review, International Journal of Precision Engineering and Manufacturing, vol. 17, No. 4, (Apr. 2016) pp. 1-14.
Frederik C Krebs, Fabrication and processing of polymer solar cells: A review of printing and coating techniques, Solar Energy Materials & Solar Cells 93 (2009) pp. 394-412.

* cited by examiner

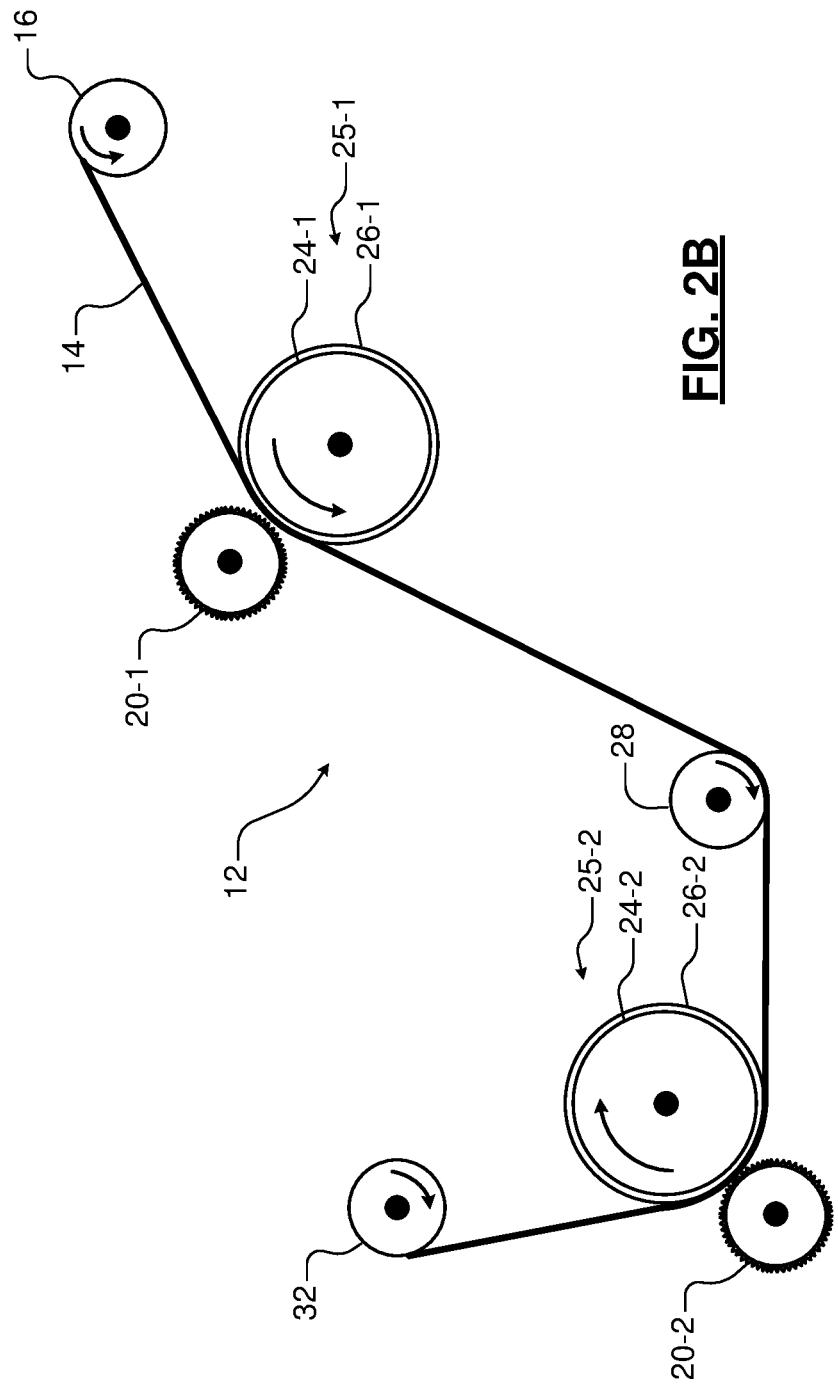

MILLING OF FLEX FOIL WITH TWO CONDUCTIVE LAYERS FROM BOTH SIDES

CROSS-REFERENCE TO RELATED APPLICATIONS

This application is a U.S. National Phase Application under 35 U.S.C. 371 of International Application No. PCT/US2020/026630, filed on Apr. 3, 2020, which claims priority to U.S. patent application Ser. No. 16/389,277, filed on Apr. 19, 2019. The entire disclosures of the applications referenced above are incorporated herein by reference.

FIELD

The present disclosure relates to wiring of electrical components, and more particularly to milling of flex foil with two conductive layers from both sides.

BACKGROUND

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

Wiring harnesses are used to connect electrical components in various applications. When a significant number of components need to be connected in a given location, a plurality of wires, printed circuit boards (PCBs) and/or flexible substrates with conductive traces may be used. Typically, the flexible substrates include a single conductive layer and outer insulating layers (referred to herein as flexible foil or flex foil). The single conductive layer may be patterned to define traces, fingers and other structures that can be used to provide multiple connections.

SUMMARY

A method for milling flex foil includes providing a web of flex foil including a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. The method includes dry milling one side of the web using a first cliché pattern including raised portions and non-raised portions to selectively remove at least one of the first conductive layer and the first insulating layer. The method includes dry milling an opposite side of the web using a second cliché pattern including upper raised portions, lower raised portions and non-raised portions to selectively remove the second insulating layer.

In other features, the first cliché pattern removes the at least one of the first insulating layer and the first conductive layer adjacent to the raised portions and does not remove the first insulating layer and the first conductive layer adjacent to the non-raised portions. The upper raised portions of the second cliché pattern remove the second insulating layer on the opposite side of the web at locations where the at least one of the first insulating layer and the first conductive layer are removed. The lower raised portions of the second cliché pattern remove the second insulating layer on the opposite side of the web at locations where the at least one of the first insulating layer and the first conductive layer are not removed. The non-raised portions of the second cliché pattern do not remove the second insulating layer.

In other features, the method includes feeding the web between a first milling wheel, arranged on the one side of the web, and a first cliché arranged on the opposite side of the web, wherein the first cliché includes the first cliché pattern. The method includes feeding the web between a second milling wheel, arranged on the opposite side of the web, and a second cliché located on the one side of the web, wherein the second cliché includes the second cliché pattern.

In other features, the method includes feeding the web between a first milling wheel, arranged on the one side of the web, and a first cliché arranged on the opposite side of the web, wherein the first cliché includes the first cliché pattern; changing the first cliché pattern on the first cliché to the second cliché pattern; inverting and aligning the web; and feeding the web between the first milling wheel and the first cliché.

In other features, the first conductive layer and the second conductive layer have a thickness in a range from 5 μm to 40 μm.

A flex foil includes a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. One side of the flex foil is dry milled using a first cliché pattern including raised portions and non-raised portions to selectively remove at least one of the first conductive layer and the first insulating layer. An opposite side of the flex foil is dry milled using a second cliché pattern including upper raised portions, lower raised portions and non-raised portions to selectively remove the second insulating layer.

In other features, the first cliché pattern removes at least one of the first insulating layer and the first conductive layer adjacent to the raised portions and does not remove the first insulating layer and the first conductive layer adjacent to the non-raised portions. The upper raised portions of the second cliché pattern remove the second insulating layer on the opposite side of the flex foil at locations where the at least one of the first insulating layer and the first conductive layer are removed. The lower raised portions of the second cliché pattern remove the second insulating layer on the opposite side of the flex foil at locations where the at least one of the first insulating layer and the first conductive layer are not removed. The non-raised portions of the second cliché pattern do not remove the second insulating layer.

In other features, the flex foil is fed between a first milling wheel, arranged on the one side of the flex foil, and a first cliché arranged on the opposite side of the flex foil, wherein the first cliché includes the first cliché pattern. The flex foil is fed between a second milling wheel, arranged on the opposite side of the flex foil, and a second cliché arranged on the one side of the flex foil, wherein the second cliché includes the second cliché pattern.

In other features, the flex foil is fed between a first milling wheel, arranged on the one side of the flex foil, and a first cliché arranged on the opposite side of the flex foil, wherein the first cliché includes the first cliché pattern. The first cliché pattern on the first cliché is changed to the second cliché pattern. The flex foil is inverted and aligned. The flex foil is fed between the first milling wheel and the first cliché.

In other features, the first conductive layer and the second conductive layer have a thickness in a range from 5 μm to 40 μm.

A flex foil includes a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. A first portion of the first insulating layer and the first conductive layer are milled to the one surface of the substrate at a first location. A first portion of the second insulating layer is milled on an opposite surface of the substrate at the first location.

In other features, the first conductive layer and the second conductive layer have a thickness in a range from 5 µm to 40 µm.

In other features, a second portion of the first insulating layer and the first conductive layer are not milled on the one surface of the substrate at a second location, and a second portion of the second insulating layer is milled on the opposite surface of the substrate at the second location.

In other features, a third portion of the first insulating layer and the first conductive layer is milled to the one surface of the substrate at a third location. A third portion of the second insulating layer is not milled on the opposite surface of the substrate at the third location.

In other features, a fourth portion of the first insulating layer and the first conductive layer are not milled on the one surface of the substrate at a fourth location. A fourth portion of the second insulating layer is not milled on the opposite surface of the substrate at the fourth location.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2B is a side view of an example of another milling system for milling a flex foil including two conductive layers from both sides according to the present disclosure;

In the drawings, reference numbers may be reused to identify similar and/or identical elements.

DETAILED DESCRIPTION

Figure 1A:
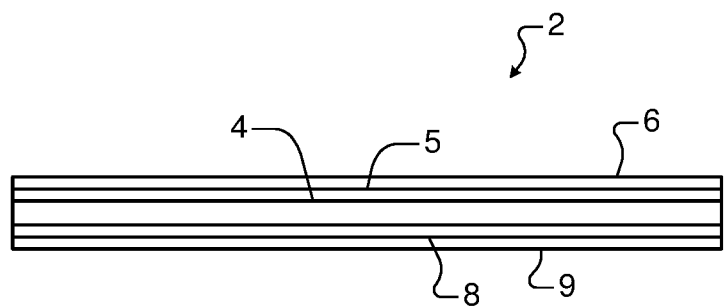
FIG. 1A is a side cross-sectional view of an example of a flex foil including two conductive layers before milling according to the present disclosure.

Typically, the flexible substrates (collectively referred to herein as flexible foil or flex foil) include a single conductive layer and first and second outer insulating layers. The single conductive layer may be patterned using photolithography or dry milled to define traces, fingers and other structures that can be used to provide multiple connections. In some situations, a higher density of traces and connections need to be provided.

An additional conductive layer can be added to the flex foil. However, traditional dry milling approaches generally cannot be used to pattern the flex foil from both sides. A first pattern is milled from one side into the first conductive layer. A second pattern is used for an opposite side of the flex foil. However, the first pattern causes variations in the thickness of the flex foil and spacing between the milling wheel and the cliché during milling using the second pattern.

For example, a dry milling process for a flex foil including a single conductive layer is shown and described in U.S. Pat. No. 7,919,027, issued on Apr. 5, 2011 and entitled "Methods and Devices for Manufacturing of Electrical Components and Laminated Structures", which is hereby incorporated herein by reference in its entirety. During dry milling, a web of a flex foil including a single conducting layer and an insulating layer is fed between a cliché and a milling wheel. The cliché includes a pattern including raised portions and non-raised portions.

In some examples, the pattern is defined on a thin, flexible substrate using photolithography and the flexible substrate is attached to an outer surface of a rotating drum. The milling wheel is arranged on an opposite side of the web. The raised portions of the pattern on the cliché push the web into the milling wheel and the corresponding portions of the conductive layer and/or outer insulating layer are removed. The portions of the conductive layer that remain are thereby patterned to provide traces, pads for fingers, etc. After milling, an insulating layer or covering layer (or coverlay) can be added over the patterned conductive layer and an additional milling step can be performed.

As can be appreciated, however, the process cannot simply be repeated on the opposite side to pattern a second conductive layer of the flex foil. The removed material of the first conductive layer will cause problems when patterning the second pattern using the same approach as described above.

The dry milling systems and methods according to the present disclosure relate to milling of flex foil having two conductive layers from both sides. The first conductive layer and/or the insulating layer are milled as described above using a first pattern having raised portions (corresponding to locations where material is removed) and non-raised portions (corresponding to locations where material is not removed).

After milling the first conductive layer and/or the insulating layer, the web is inverted or rotated 180° and a second pattern is used to mill the opposite side of the flex foil. The second pattern includes upper raised portions (corresponding to locations where material is removed from both sides of the web), lower raised portions (corresponding to locations where material is removed during the second milling step but not the first milling step), and non-raised portions (corresponding to locations where material is not removed).

In some examples, the conductive layers are made of metal such as Al or Cu and have a thickness in a range from 5 µm to 40 µm, although other metals or thicker or thinner layers can be used. For example only, Cu having a thickness of 9 µm, 18 µm, or 35 µm, or Al having a thickness of 9 µm or 18 µm may be used. In some examples, the insulating layers and/or the substrate include film such as polyethylene terephthalate (PET), polyethylene naphthalate (PEN), or polyimide (PI), although other substrate or insulating materials can be used.

Figure 1B:
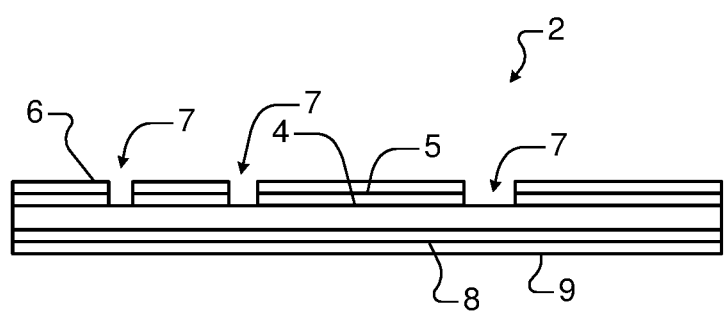
FIG. 1B is a side cross-sectional view of an example of the flex foil including two conductive layers after milling one side of the flex foil according to the present disclosure.
Figure 1C:
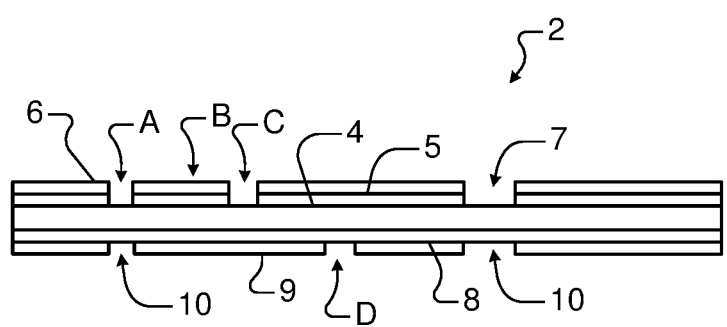
FIG. 1C is a side cross-sectional view of an example of the flex foil including two conductive layers after milling both sides of the flex foil according to the present disclosure.

Referring now to FIGS. 1A to 1C, milling of a flex foil 2 from both sides is shown. In FIG. 1A, the flex foil 2 is shown prior to milling. The flex foil 2 includes a substrate 4, a first conductive layer 5 arranged on one side of the substrate 4, and a first insulating layer 6 arranged on the first conductive layer 5. The flex foil 2 further includes a second conductive layer 8 arranged on an opposite side of the substrate 4 and a second insulating layer 9 arranged on the second conductive layer 8. In FIG. 1B, a first cliché pattern is used to mill the first conductive layer 5 and the first insulating layer 6 as shown at one or more locations identified at 7. In FIG. 1C, a second cliché pattern is used to selectively mill the second insulating layer 9 at one or more locations identified at 10.

Figure 2A:
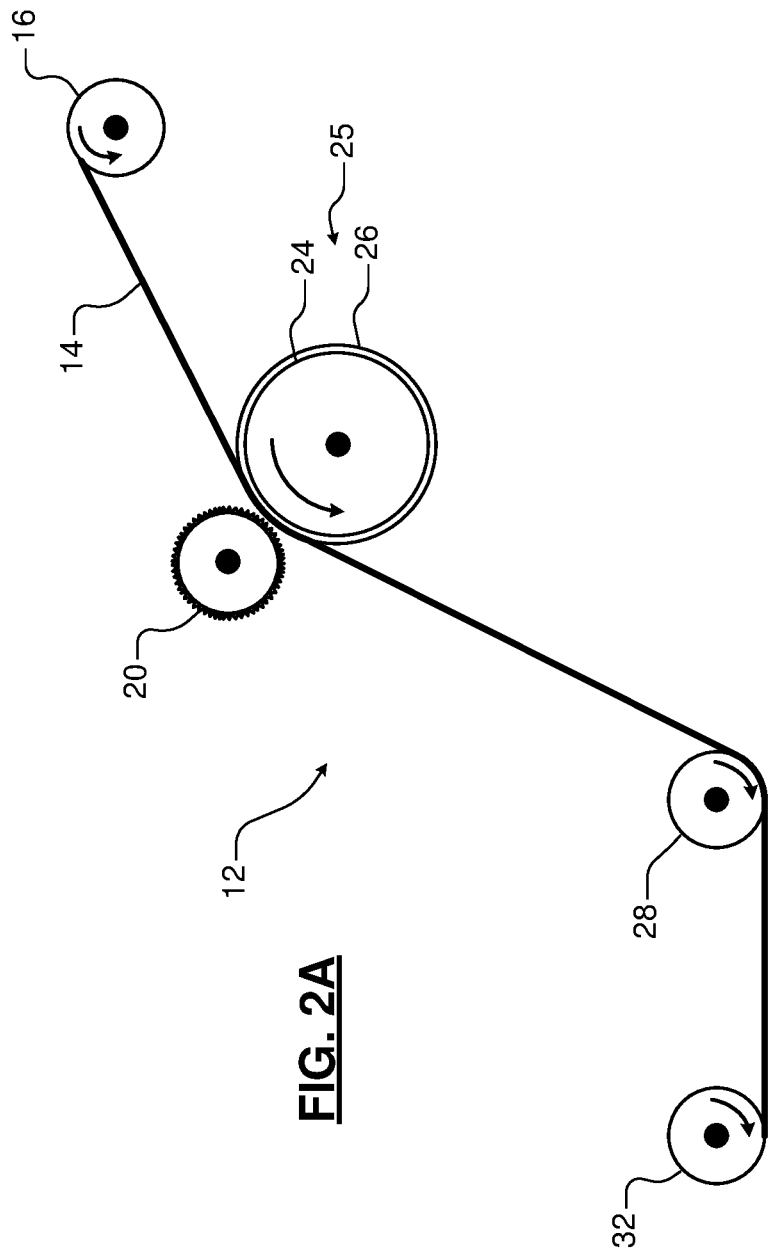
FIG. 2A is a side view of an example of a milling system for milling a flex foil including two conductive layers from both sides according to the present disclosure.

Referring now to FIG. 2A, a milling system 12 for milling a web 14 of the flex foil 2 is shown. A first roll 16 supplies the web 14 of the flex foil 2. The web 14 is fed between the milling wheel 20 and a cliché 25. In some examples, the cliché 25 includes a rotating drum 24. A flexible substrate 26 defining a first pattern or a second pattern is attached to the rotating drum 24. Alternately, the first or second pattern can be made directly on the rotating drum 24. In some examples, the first pattern or the second pattern is defined on the flexible substrate 26 or the rotating drum 24 using photolithography techniques, although other techniques can be used.

The milling wheel 20 is arranged within a predetermined distance of the rotating drum 26 to allow milling of raised portions of the web 14 as the web passes through. The milling wheel 20 includes teeth that cut portions of the web 14 that are raised by corresponding raised portions of the first pattern. The web 14 is fed around a second drum 28 to a roll 32.

The first conductive layer 5 and/or the first insulating layer 6 are milled as described above using the first pattern. The raised portions of the first pattern correspond to locations where the first conductive layer 5 and/or the first insulating layer 6 are removed. The first pattern includes non-raised portions corresponding to locations where material is not removed.

After the first milling operation, the web is rotated 180° and the first pattern is replaced by a second pattern. Alternately, a second cliché can be used as will be shown in FIG. 2B. The second pattern includes upper raised portions (corresponding to locations where material is removed from both surfaces of the web 14), lower raised portions (corresponding to locations where material is removed from the side corresponding to the second conducting layer but not from the side corresponding to the first conducting layer), and non-raised portions (corresponding to locations where material is not removed from the side corresponding to the second conducting layer).

In FIG. 2B, the milling system 12 includes a first cliché 25-1 (including a rotating drum 24-1 and a flexible substrate 26-1) arranged adjacent to a first milling wheel 20-1 and a second cliché 25-2 (including a rotating drum 24-2 and a flexible substrate 26-2) arranged adjacent to a second milling wheel 20-2. The first cliché 25-1 is arranged on one side of the web 14 and the second cliché 25-2 is arranged on an opposite side of the web 14. The first cliché 25-1 mills the first pattern on the one side. The second cliché 25-2 mills the second pattern on the opposite side. After the milling is performed, additional operations can be performed. For example, a cutting operation can be performed to separate individual flex foils from the web 14.

Figure 3A:
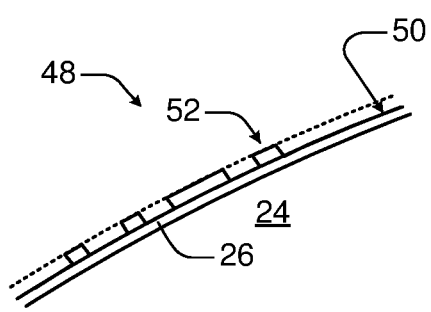
FIG. 3A is a side view of a portion of a first cliché pattern used to mill a first side of the flex foil according to the present disclosure.

Referring now to FIG. 3A, a surface of the substrate 26 defines a portion of a first pattern 48 that is used to mill one side of the web 14. The first pattern 48 includes non-raised portions 50 (where no milling of the web 14 occurs) and raised portions 52 (where the insulating material and/or the first conductive layer are removed from the one side of the web 14).

Figure 3B:
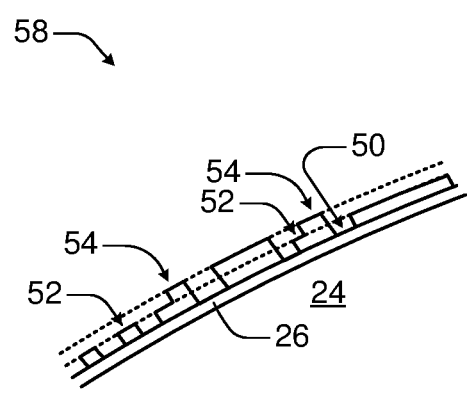
FIG. 3B is a side view of a portion of a second cliché pattern used to mill a second side of the flex foil after the first side is milled according to the present disclosure.

Referring now to FIG. 3B, a surface of the substrate 26 defines a second pattern 58 that is used to mill an opposite side of the web 14. The second pattern 58 includes upper raised portions 54 (corresponding to locations where material is removed from both sides of the web 14). The second pattern 58 includes lower raised portions 52 (corresponding to locations where material is removed from the side of the web 14 adjacent to the second conductive layer but not from the side adjacent to the first conductive layer). The second pattern 58 includes non-raised portions 50 (corresponding to locations where material is not removed from the second conductive layer).

Referring back to FIG. 1C, in locations A, milling is performed on both sides of the flex foil 2. A corresponding portion of the first pattern for the location A will have raised portions (to remove the insulating layer and/or the first conductive layer). A corresponding portion of the second pattern will have the upper raised portions to offset the material removed by the first pattern and to mill the second insulating layer. In locations B, no milling from either side will occur. Corresponding portions of both the first and second patterns will have non-raised portions.

In locations C, corresponding portions of the first pattern will have raised portions to remove the first conductive layer and/or the insulating layer. Corresponding portions of the second pattern will have non-raised portions since the second insulating layer is not removed.

In locations D, corresponding portions of the first pattern will have non-raised portions so that material is not removed. Corresponding portions of the second pattern will have lower raised portions to remove the second insulating layer.

Figure 4:
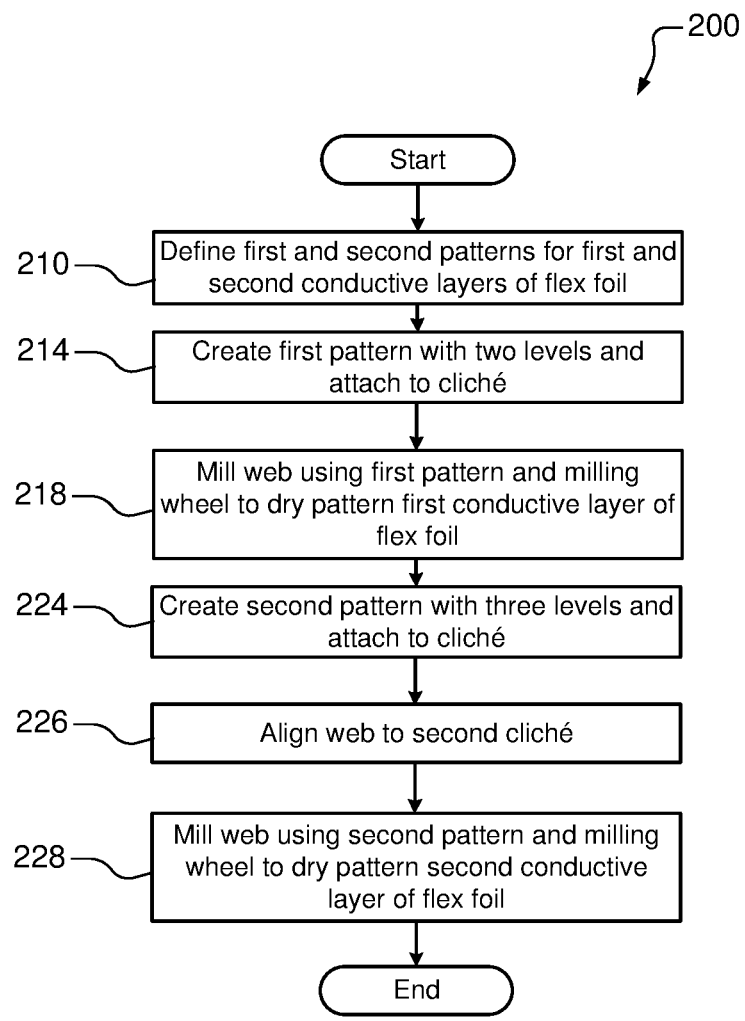
FIG. 4 is a flowchart of an example of a method for milling the flex foil with two conductive layers according to the present disclosure.

Referring now to FIG. 4, a method 200 for milling the flex foil/web from both sides is shown. At 210, first and second patterns for first and second conductive layers of the flex foil are defined based on a desired layout. At 214, a first pattern is created on a substrate or a drum to define raised and non-raised portions. If the substrate is used, the substrate is attached to the cliché. At 218, the web/flex foil is milled using the first pattern on the cliché and the milling wheel to dry pattern one side of the web/flex foil.

At 224, a second pattern is created on a substrate or a drum to define upper raised portions, lower raised portions and non-raised portions. If the substrate is used, the substrate with the first pattern is removed and the second pattern is attached to the cliché. Alternately, a second cliché is used as shown in FIG. 2B. At 276, the web including the flex foil is optionally inverted and aligned to the second cliché pattern. The web is milled using the second cliché pattern and the milling wheel to dry pattern an opposite side of the web/flex foil.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A method for milling flex foil, comprising:
   providing a web of flex foil including:
      a substrate;
      a first conductive layer arranged on one surface of the substrate;
      a second conductive layer arranged on an opposite surface of the substrate;
      a first insulating layer arranged adjacent to the first conductive layer; and
      a second insulating layer arranged adjacent to the second conductive layer;
   dry milling one side of the web using a first cliché pattern including raised portions and non-raised portions to selectively remove only the first conductive layer and the first insulating layer; and
   dry milling an opposite side of the web using a second cliché pattern including upper raised portions, lower raised portions and non-raised portions to selectively remove only the second insulating layer.

2. The method of claim 1, wherein the first cliché pattern removes the at least one of the first insulating layer and the first conductive layer adjacent to the raised portions and does not remove the first insulating layer and the first conductive layer adjacent to the non-raised portions.

3. The method of claim 1, wherein the upper raised portions of the second cliché pattern remove the second insulating layer on the opposite side of the web at locations where the at least one of the first insulating layer and the first conductive layer are removed.

4. The method of claim 3, wherein the lower raised portions of the second cliché pattern remove the second insulating layer on the opposite side of the web at locations where the at least one of the first insulating layer and the first conductive layer are not removed.

5. The method of claim 4, wherein the non-raised portions of the second cliché pattern do not remove the second insulating layer.

6. The method of claim 1, further comprising:
   feeding the web between a first milling wheel, arranged on the one side of the web, and a first cliché arranged on the opposite side of the web, wherein the first cliché includes the first cliché pattern; and
   feeding the web between a second milling wheel, arranged on the opposite side of the web, and a second cliché located on the one side of the web, wherein the second cliché includes the second cliché pattern.

7. The method of claim 1, further comprising:
   feeding the web between a first milling wheel, arranged on the one side of the web, and a first cliché arranged on the opposite side of the web, wherein the first cliché includes the first cliché pattern;
   changing the first cliché pattern on the first cliché to the second cliché pattern;
   inverting and aligning the web; and
   feeding the web between the first milling wheel and the first cliché.

8. The method of claim 1, wherein the first conductive layer and the second conductive layer have a thickness in a range from 5 µm to 40 µm.

* * * * *